(12) United States Patent
Chang et al.

(10) Patent No.: US 8,425,736 B2
(45) Date of Patent: Apr. 23, 2013

(54) METHOD FOR MAKING COATED ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Shun-Mao Lin, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/233,870

(22) Filed: Sep. 15, 2011

(65) Prior Publication Data
US 2012/0270068 A1 Oct. 25, 2012

(30) Foreign Application Priority Data
Apr. 21, 2011 (CN) .......................... 2011 1 0100742

(51) Int. Cl.
| C23C 14/00 | (2006.01) |
| C23C 14/14 | (2006.01) |
| C23C 14/16 | (2006.01) |
| C23C 14/34 | (2006.01) |
| B05D 3/00 | (2006.01) |

(52) U.S. Cl.
USPC ...................... 204/192.15; 427/328

(58) Field of Classification Search ................. None
See application file for complete search history.

(56) References Cited

U.S. PATENT DOCUMENTS

| 5,904,859 | A | * | 5/1999 | Degani ............................ 216/18 |
| 6,042,777 | A | * | 3/2000 | Lo et al. ........................... 419/8 |
| 6,597,069 | B1 | * | 7/2003 | Degani et al. ................. 257/778 |
| 2006/0251917 | A1 | * | 11/2006 | Chiang et al. ................. 428/674 |
| 2012/0156511 | A1 | * | 6/2012 | Wang et al. .................... 428/457 |
| 2012/0171512 | A1 | * | 7/2012 | Chiang et al. ................. 428/626 |

FOREIGN PATENT DOCUMENTS

JP       11-050242    *    2/1999

OTHER PUBLICATIONS

Machine Translation, Takashima, JP 11-050242, Feb. 1999.*

* cited by examiner

*Primary Examiner* — Michael La Villa
(74) *Attorney, Agent, or Firm* — Altis Law Group, Inc.

(57) ABSTRACT

A method for making a coated article includes the steps of: providing a substrate; forming a copper-cobalt target by a hot isostatic pressing process using copper powder and cobalt powder; forming a copper-cobalt alloy layer on the substrate by vacuum sputtering using the copper-cobalt target. A coated article is also described.

9 Claims, 2 Drawing Sheets

METHOD FOR MAKING COATED ARTICLE

CROSS-REFERENCE TO RELATED APPLICATIONS

This application is related to the U.S. patent applications listed below. The current application and the related applications have the same assignee. The disclosure of each of the listed applications is incorporated by reference into the instant applications.

| Attorney Docket No. | U.S. Ser. No. | Current Status | Title | Inventors |
|---|---|---|---|---|
| US 39196 | 13/233,898 | pending | METHOD FOR MAKING COATED ARTICLE AND COATED ARTICLE THEREOF | HSIN-PEI CHANG et al. |
| US 39197 | 13/233,909 | pending | METHOD FOR MAKING COATED ARTICLE AND COATED ARTICLE THEREOF | HSIN-PEI CHANG et al. |

BACKGROUND

1. Technical Field

The present disclosure relates to a method for making coated articles and a coated article formed by the method.

2. Description of Related Art

Alloy coatings may be applied on metal substrates by hot dipping processes or thermal spraying using alloy powder. Copper (Cu) and cobalt (Co) are widely used for their excellent properties and low costs. However, stable Cu—Co alloy for a hot dipping process or thermal spraying may be difficult to obtain because the Cu and Co are smelted at a very high temperature, which may cause the Cu-Co alloy to disintegrate and form a Cu phase and a Co phase. When being quenched, the Cu phase and Co phase will separate and thus Cu—Co alloy cannot be formed.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
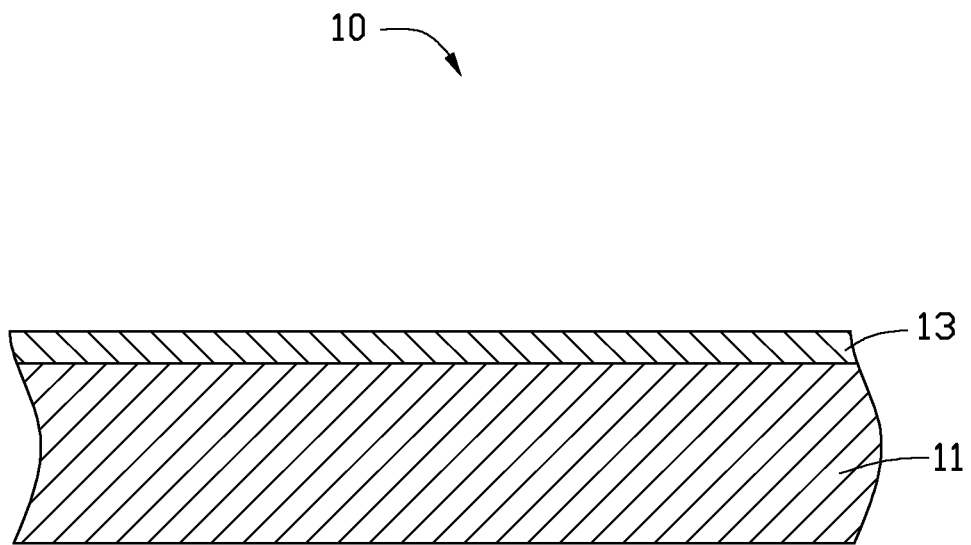
FIG. 1 is a cross-sectional view of an exemplary embodiment of a coated article.

Referring to FIG. 1, according to an exemplary embodiment, a method for making a coated article 10 may include the following steps:

A substrate 11 is provided. The substrate 11 may be made of stainless steel or copper alloy.

The substrate 11 is cleaned in an ultrasonic cleaning device (not shown) filled with ethanol or acetone and then dried.

Figure 2:
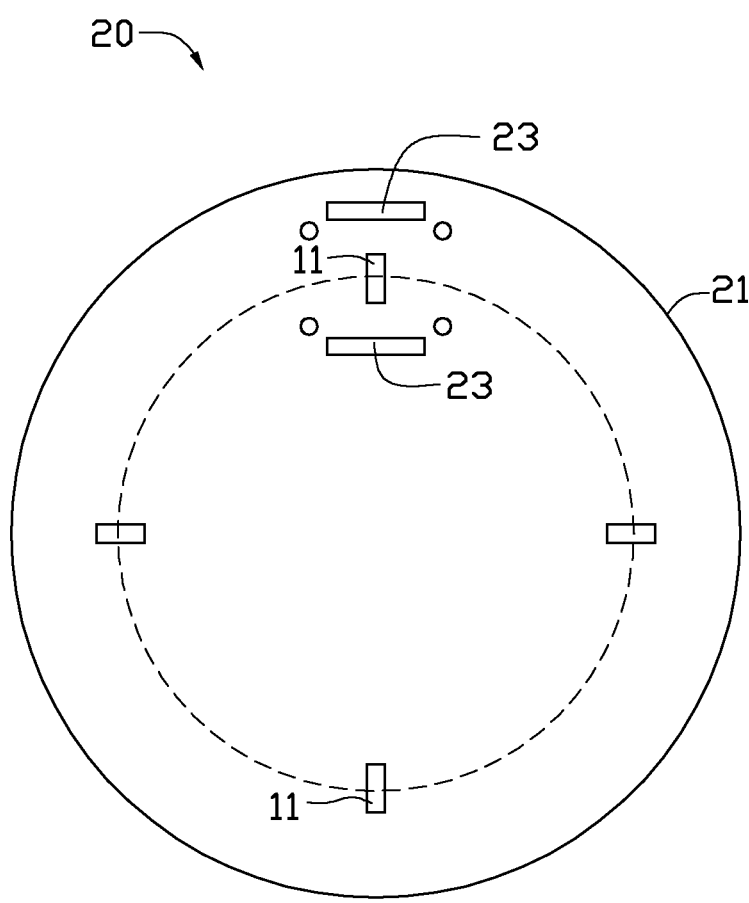
FIG. 2 is an overhead view of an exemplary embodiment of a vacuum sputtering device.

A copper-cobalt (Cu—Co) alloy layer 13 may be magnetron sputtered on the pretreated substrate 11. Referring to FIG. 2, the substrate 11 may be positioned in a coating chamber 21 of a vacuum sputtering device 20. The coating chamber 21 is fixed with Cu—Co targets 23.

The mass ratio between the Cu and Co in the Cu—Co target 23 may be about 1:4 to about 4:1. The Cu—Co targets 23 may be formed by a method as follows:

Copper powder and cobalt powder are mixed and positioned in a ball mill (not shown) to be grinded for about 120 min-200 min to get a mixture. The copper powder has a purity of more than 99.9% and an average particle size of about 10 μm-100 μm. The cobalt powder has a purity of more than 99.9% and an average particle size of about 10 μm-80 μm. The mixture is then hot isostatic pressed to form a semi-finished product. The semi-finished product is sintered for about 1 hour to 1.5 hours at a temperature of about 1150° C.-1200° C. and then cooled to form the Cu—Co targets 23.

The coating chamber 21 is evacuated to about $8.0 \times 10^{-3}$ Pa. Argon (Ar) gas having a purity of about 99.999% may be used as a working gas and is fed into the coating chamber 21 at a flow rate of about 100 standard-state cubic centimeters per minute (sccm) to about 300 sccm. The internal temperature of the coating chamber 21 may be heated to about 120° C.-180° C. A power of about 6 kilowatt (kW)-13 kW is applied to the Cu—Co targets 23, and the copper atoms and cobalt atoms are sputtered off from the Cu—Co targets 23 to deposit on the substrate 11 and form the Cu—Co alloy layer 13. The temperature in the coating chamber 21 is much lower than the temperature for smelting Cu and Co, so the Cu and Co deposited on the substrate 11 in the exemplary embodiment will not phase separate, thus a Cu-Co alloy layer 13 is formed. The Cu—Co alloy layer 13 has a thickness of about 120 nm-200 nm. During the depositing process, the substrate 11 may have a bias voltage of about −100 V to about −200 V. Depositing of the Cu—Co alloy layer 13 may take about 30 min-50 min.

FIG. 1 shows the coated article 10 formed by the exemplary method. The coated article 10 includes the substrate 11 and the Cu—Co alloy layer 13 formed on a surface of the substrate 11. The substrate 11 may be made of stainless steel or copper alloy. The mass ratio between the Cu and Co within the Cu—Co alloy layer 13 may be about 1:4 to about 4:1. The Cu—Co alloy layer 13 has excellent mechanical and electrical properties.

Specific examples of making the coated article 10 are described as follows. The process of cleaning the substrate 11 in these specific examples may be substantially the same as previously described so it is not described here again. Additionally, the magnetron sputtering process of forming the Cu—Co alloy layer 13 in the specific examples are substantially the same as described above, and the specific examples mainly emphasize the different process parameters of making the coated article 10.

EXAMPLE 1

The substrate 11 is made of stainless steel.

Forming the Cu—Co targets 23: copper powder having an average particle size of 30 μm-60 μm and cobalt powder having an average particle size of 30 μm-60 μm are mixed with a mass ratio of 4:1 and positioned in a ball mill to be grinded for 200 min and then be hot isostatic pressed to form a semi-finished product; the semi-finished product is sintered for 1 hour at a temperature of 1180° C. and then cooled to form the Cu—Co targets 23.

Sputtering to form the Cu—Co alloy layer 13 on the substrate 11: the flow rate of Ar is 300 sccm; the substrate 11 has a bias voltage of −180 V; the Cu—Co targets 23 are applied with a power of 8 kW; the internal temperature of the coating chamber 21 is 150° C.; sputtering of the Cu—Co alloy layer 13 takes 30 min; the Cu—Co alloy layer 13 has a thickness of 130 nm.

EXAMPLE 2

The substrate 11 is made of copper-zinc alloy, the copper within the copper-zinc alloy has a mass percentage of more than 70%.

Forming the Cu—Co targets 23: copper powder having an average particle size of 30 μm-60 μm and cobalt powder having an average particle size of 30 μm-60 μm are mixed with a mass ratio of 1:4 and positioned in a ball mill to be grinded for 120 min and then be hot isostatic pressed to form a semi-finished product; the semi-finished product is sintered for 1.5 hours at a temperature of 1200° C. and then cooled to form the Cu—Co targets 23.

Sputtering to form the Cu—Co alloy layer 13 on the substrate 11: the flow rate of Ar is 300 sccm; the substrate 11 has a bias voltage of −100 V; the Cu—Co targets 23 are applied with a power of 13 kW; the internal temperature of the coating chamber 21 is 180° C.; sputtering of the Cu-Co alloy layer 13 takes 50 min; the Cu—Co alloy layer 13 has a thickness of 200 nm.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A method for making a coated article, comprising:
    providing a substrate;
    forming a copper-cobalt target by a hot isostatic pressing process using copper powder and cobalt powder;
    forming a copper-cobalt alloy layer on the substrate by vacuum sputtering using the copper-cobalt target, the copper and cobalt of the copper-cobalt alloy layer being not phase separate.

2. The method as claimed in claim 1, wherein mass ratio between the copper and cobalt within the copper-cobalt target is about 1:4 to about 4:1.

3. The method as claimed in claim 1, wherein the copper powder and the cobalt powder all have a purity of more than 99.9%, the copper powder has an average particle size of about 10 μm to about 100 μm, and the cobalt powder has an average particle size of about 10 μm to about 80 μm.

4. The method as claimed in claim 3, wherein forming the copper-cobalt target is carried out by hot isostatic pressing the copper powder and cobalt powder for about 120 min to about 200 min and then sintering for about 1 hour to about 1.5 hours at about 1150° C. to about 1200° C.

5. The method as claimed in claim 1, wherein forming the copper-cobalt alloy layer uses a magnetron sputtering process, wherein the sputtering process uses argon as a working gas, the argon having a flow rate of about 100 sccm to about 300 sccm; wherein the copper-cobalt target is applied with a power of about 6 kW to about 13 kW; and wherein magnetron sputtering of the copper-cobalt alloy layer is conducted at a temperature of about 120° C. to about 180° C. and takes about 30 min to about 50 min.

6. The method as claimed in claim 5, wherein the copper-cobalt alloy layer has a thickness of about 120 nm to about 200 nm.

7. The method as claimed in claim 5, wherein the substrate has a bias voltage of about −100 V to about −200 V during sputtering of the copper-cobalt alloy layer.

8. The method as claimed in claim 1, further comprising a step of ultrasonic cleaning the substrate before forming the copper-cobalt alloy layer.

9. The method as claimed in claim 1, wherein the substrate is made of stainless steel or copper alloy.

\* \* \* \* \*